(12) United States Patent
Yamamoto et al.

(10) Patent No.: US 9,117,735 B2
(45) Date of Patent: Aug. 25, 2015

(54) HYBRID CIRCUIT

(75) Inventors: Susumu Yamamoto, Makinohara (JP); Yoshihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 106 days.

(21) Appl. No.: 13/393,079

(22) PCT Filed: Dec. 22, 2010

(86) PCT No.: PCT/JP2010/073858
§ 371 (c)(1),
(2), (4) Date: Feb. 28, 2012

(87) PCT Pub. No.: WO2011/078404
PCT Pub. Date: Jun. 30, 2011

(65) Prior Publication Data
US 2012/0155036 A1    Jun. 21, 2012

(30) Foreign Application Priority Data
Dec. 22, 2009    (JP) .................................. 2009-290412

(51) Int. Cl.
*H01L 25/16* (2006.01)
(52) U.S. Cl.
CPC ......... *H01L 25/16* (2013.01); *H01L 2924/0002* (2013.01)
(58) Field of Classification Search
CPC .................................................... H01L 25/16
USPC ................... 361/717, 704, 760, 748
See application file for complete search history.

(56) References Cited

U.S. PATENT DOCUMENTS

| 4,780,795 | A | | 10/1988 | Meinel | |
|---|---|---|---|---|---|
| 4,786,826 | A | | 11/1988 | Clemente | |
| 5,602,451 | A | * | 2/1997 | Kohge et al. | 318/293 |
| 5,640,293 | A | * | 6/1997 | Dawes et al. | 361/93.7 |
| 5,736,774 | A | * | 4/1998 | Fujihira | 257/500 |
| 6,215,681 | B1 | * | 4/2001 | Schuurman et al. | 363/141 |
| 6,232,562 | B1 | * | 5/2001 | Kikuchi et al. | 174/260 |
| 7,183,835 | B2 | * | 2/2007 | Sakata et al. | 327/434 |
| 2005/0146823 | A1 | | 7/2005 | Sakata et al. | |
| 2006/0205112 | A1 | | 9/2006 | Standing et al. | |

(Continued)

FOREIGN PATENT DOCUMENTS

CN    2135423 Y    6/1993
CN    1638224 A    7/2005

(Continued)

OTHER PUBLICATIONS

International Search Report dated Jul. 20, 2011 in counterpart international application No. PCT/JP2010/073858.

(Continued)

*Primary Examiner* — Timothy Thompson
*Assistant Examiner* — Ahmad D Barnes
(74) *Attorney, Agent, or Firm* — Sughrue Mion, PLLC (57) ABSTRACT

A hybrid circuit includes a high-voltage circuit and a low-voltage circuit having different power supply voltages, respectively, a board on which a connecting terminal for connecting an external element outside of the hybrid circuit is mounted; and a hybrid integrated circuit mounted on the board. The low-voltage circuit includes a control unit for controlling an operation of the high-voltage circuit. The control unit and the high-voltage circuit are integrated in the hybrid integrated circuit.

6 Claims, 4 Drawing Sheets

(56) References Cited

U.S. PATENT DOCUMENTS

2009/0086457 A1* 4/2009 Motegi et al. ................. 361/807
2009/0243764 A1   10/2009 Hauenstein

FOREIGN PATENT DOCUMENTS

| | | | |
|---|---|---|---|
| JP | 62236358 | A | 10/1987 |
| JP | 11176479 | A | 7/1999 |
| JP | 2001267479 | A | 9/2001 |
| JP | 20069687 | A | 1/2006 |
| JP | 2009108719 | A | 5/2009 |
| JP | 2009170947 | A | 7/2009 |
| JP | 2009232637 | A | 10/2009 |
| WO | WO 2006096639 | A2 | 9/2006 |

OTHER PUBLICATIONS

Written Opinion dated Jul. 20, 2011 in counterpart international application No. PCT/JP2010/073858.
Office Action dated Sep. 4, 2013 issued by the Japanese Patent Office in counterpart Japanese Application No. 2009290412.
Communication dated May 5, 2014 from the State Intellectual Property Office of P.R. China in a counterpart application No. 201080040605.3.
Office Action, Issued by the State Intellectual Property Office of P.R. China, Dated Nov. 25, 2014, in counterpart Chinese Application No. 201080040605.3.
Office Action dated Jun. 3, 2015, issued by the State Intellectual Property Office of the People's Republic of China in counterpart Chinese Application No. 201080040605.3.

* cited by examiner

HYBRID CIRCUIT

TECHNICAL FIELD

The present invention relates to a hybrid circuit configured by a high-voltage circuit and a low-voltage circuit having different power supply voltages, respectively.

BACKGROUND ART

As a hybrid circuit configured by a high-voltage circuit and a low-voltage circuit having different power supply voltages, respectively, there have been proposed hybrid circuits disclosed in JP-A-11-176479 (PTL 1) and JP-A-2006-009687 (PTL 2). In each of the patent literatures, the high-voltage circuit and the low-voltage circuit are mounted on different boards and are disposed so as to be laminated to each other thereby suppressing the increase of the disposing area of the boards.

CITATION LIST

Patent Literature

[PTL 1] JP-A-11-176479
[PTL 2] JP-A-2006-009687

SUMMARY OF INVENTION

Technical Problem

As an examples of the fields in which the hybrid circuits each configured by a high-voltage circuit and a low-voltage circuit as described above are used, there are an electric vehicle (EV) and a hybrid electric vehicle (HEV, a vehicle using both an engine and a motor generator). In each of these vehicles, the low-voltage circuit, which is operated by the same voltage (for example, an effective voltage of 12 volt) as that used in a conventional vehicle using an engine as a power source, is provided in relation to a control system and electrical equipments within the vehicle. Further, the high-voltage circuit operated by a voltage (for example, an effective voltage of 200 volt) higher than that of the low-voltage circuit is provided in relation to the motor (or the motor generator) as the power source and the peripheral devices thereof.

In the hybrid circuit used in each of the electric vehicle and the hybrid electric vehicle, it is important in particular to provide a countermeasure for preventing an abnormal discharge due to a short circuit in view of the design of the circuit and the board. This is because the battery mounted on a vehicle has been shifted to a lithium ion battery of a higher voltage from a lead acid battery. That is, in the lithium ion battery, the battery function is more likely damaged by the abnormal discharge as compared with the lead acid battery. Further, an amount of heat generation of the lithium ion battery and the wiring thereof at the time of the abnormal discharge is larger than lead acid battery.

In the fields other than the vehicles, as to the hybrid circuit configured by the high-voltage circuit and the low-voltage circuit, it is necessary to pay attention to the design of the circuit and the board so as to more effectively prevent the short circuit as compared with the case where only the low-voltage circuit is mounted on the board. This is important regardless whether or not the lithium ion battery, which is largely damaged at the time of the short circuit, is used as a power source.

In this respect, each of the aforesaid patent literatures (PTL 1 and PTL 2) merely proposes the method of the design for suppressing the disposing area of the boards but does not teach or suggest any countermeasure with respect the aforesaid short circuit.

Further, in such the hybrid circuit configured by the high-voltage circuit and the low-voltage circuit, the high-voltage circuit and the low-voltage circuit for controlling the operation of the high-voltage circuit are mounted on the different boards, respectively. Thus, when the design change etc. of the high-voltage circuit is caused, there arises a problem that it is necessary to change the entirety of the hybrid circuit.

The invention is made in order to solve the above problem of the related art and an object of the invention is to provide a hybrid circuit configured by a high-voltage circuit and a low-voltage circuit which is excellent in general-purpose properties and can suppress the increase of a disposing area and prevent the short circuit.

Solution to Problem

In order to achieve the above object, according to the present invention, there is provided a hybrid circuit, comprising:
a high-voltage circuit and a low-voltage circuit having different power supply voltages, respectively;
a board on which a connecting terminal for connecting an external element outside of the hybrid circuit is mounted; and
a hybrid integrated circuit mounted on the board,
wherein the low-voltage circuit includes a control unit for controlling an operation of the high-voltage circuit; and
wherein the control unit and the high-voltage circuit are integrated in the hybrid integrated circuit.

Preferably, the high-voltage circuit is disposed on one side of opposed two sides of the hybrid integrated circuit and the low-voltage circuit is disposed on the other side thereof.

Preferably, the high-voltage circuit includes a positive electrode side portion which is connected to a positive electrode of a high-voltage power supply under a control of the control unit and a negative electrode side portion which is connected to a negative electrode of the high-voltage power supply under the control of the control unit, and the positive electrode side portion is disposed on one side of opposed two sides of the hybrid integrated circuit and the negative electrode side portion is disposed on the other side thereof.

Advantageous Effects of Invention

By the above configuration, the hybrid integrated circuit on which the high-voltage circuit is mounted is disposed on the board on which the connecting terminal to be connected to the external element outside of the hybrid circuit are mounted. Thus, an area necessary for disposing the board of the hybrid circuit does not become larger as compared with a case where the entire constituent elements of the hybrid circuit are mounted on the board.

Further, since the high-voltage circuit is mounted on the hybrid integrated circuit, it is possible to avoid such a phenomenon that a foreign object enters into the high-voltage circuit to thereby place the circuit in a failure state due to a short-circuit.

Further, since the control unit for controlling the operation of the high-voltage circuit and the high-voltage circuit are mounted on (incorporated in) the hybrid integrated circuit, each of the high-voltage circuit and the control unit can be changed into another one of different specifications by replacing the hybrid integrated circuit by another one. Thus, when there arises a need for changing the design etc. of the high-voltage circuit, such the need can be satisfied by exchanging only the hybrid integrated circuit without changing the entirety of the hybrid circuit. Therefore, it is possible to provide the hybrid circuit of the high-voltage circuit and the low-voltage circuit excellent in the general-purpose properties.

As described above, it is possible to provide the hybrid circuit of the high-voltage circuit and the low-voltage circuit which can suppress the increase of the disposing area, prevent the generation of the short-circuit and is excellent in the general-purpose properties.

By the above configuration, the high-voltage circuit is disposed on the one side of the opposed two sides of the hybrid integrated circuit and the control unit is disposed on the other side thereof, it is possible to secure a sufficient insulation distance between the high-voltage circuit and the control unit. Thus, it is possible to avoid the generation of the short-circuit due to the voltage difference between the high-voltage circuit and the control unit.

By the above configuration, the positive electrode side portion of the high-voltage circuit to be connected to the positive terminal of the high-voltage power supply under the control of the control unit is disposed on the one side of the opposed two sides of the hybrid integrated circuit and the negative electrode side portion of the high-voltage circuit to be connected to the negative terminal of the high-voltage power supply under the control of the control unit is disposed on the other side thereof. Thus, it is possible to secure a sufficient insulation distance between the positive electrode side portion and the negative electrode side portion. Accordingly, it is possible to avoid the generation of the short-circuit due to the voltage difference between the positive electrode side portion and the negative electrode side portion.

DESCRIPTION OF EMBODIMENTS

Figure 1:
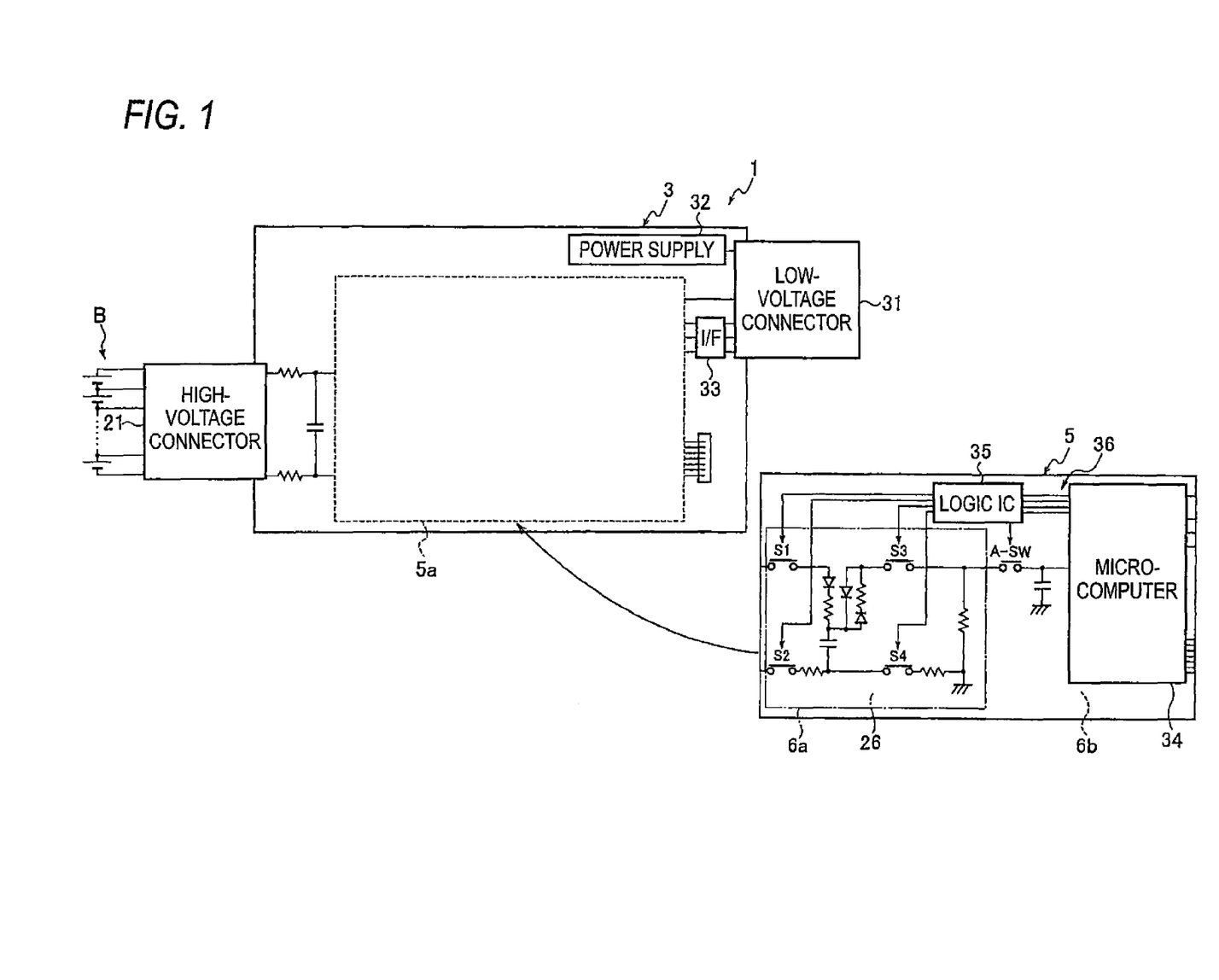
FIG. 1 is a partially exploded plan view of a hybrid circuit according to the embodiment of the invention.
Figure 2:
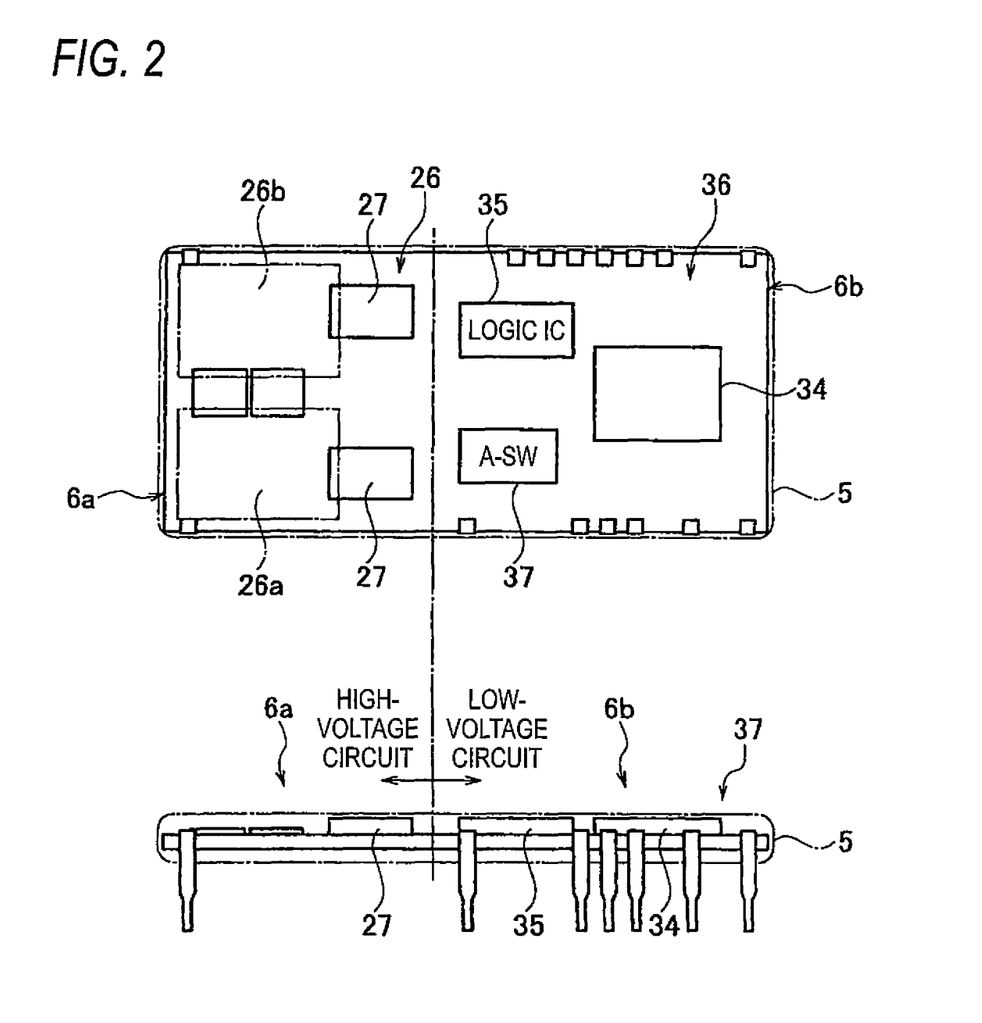
FIG. 2 is a plan view and a side view of the hybrid IC (Integrated Circuit) according to the embodiment of the invention.

Hereinafter, embodiments according to the invention will be explained with reference to drawings. First, the mounting structure of a hybrid circuit according to the embodiment of the invention will be explained with reference to FIGS. 1 and 2. FIG. 1 is a partially exploded plan view of the hybrid circuit according to the embodiment of the invention. FIG. 2 is a plan view and a side view of the hybrid IC according to the embodiment of the invention.

As shown in FIG. 1, a hybrid circuit 1 is provided at a voltage measuring device for measuring the output voltage of a lithium ion battery B (corresponding to an external element) configured by a plurality of cells. The hybrid circuit includes a board 3 and a hybrid IC (Integrated Circuit) 5.

A high-voltage connector 21 (corresponding to a connecting terminal) for connecting a high-voltage circuit to the respective cells of the lithium ion battery B is mounted on the board 3. Further, a low-voltage connector 31 (corresponding to a connecting terminal) for connecting with an ECU (Electronic Control Unit) mounted on a vehicle (not shown), for example, a power supply 32 for supplying electric power to the low-voltage connector 31, and an interface 33 coupled to the low-voltage connector 31 and a microcomputer 34 are mounted on the board 3.

Further, the board 3 has a hybrid IC mounting area 5a on which the hybrid IC 5 is mounted in a laminated manner.

The hybrid IC 5 has a high-voltage circuit mounting area 6a and a low-voltage circuit mounting area 6b for mounting a part of the high-voltage circuit and a part of a low-voltage circuit, respectively.

As shown in FIG. 2, the high-voltage circuit mounting area 6a and the low-voltage circuit mounting area 6b are provided on the one side and the other side of the opposed two sides of the hybrid IC 5, respectively.

A voltage measuring circuit (corresponding to the high-voltage circuit) 26 for measuring the output voltage of the lithium ion battery B is mounted on the high-voltage circuit mounting area 6a. Further, of the constituent elements of the low-voltage circuit, a control unit 36 for controlling the operation of the high-voltage circuit is mounted on the high-voltage circuit mounting area 6a. The control unit 36 includes the microcomputer 34, a logic IC 35 for switching the on/off states of switches S1 to S4 provided at the voltage measuring circuit 26 in accordance with a control signal outputted from the microcomputer 34, and an analog switch (hereinafter called an A-SW) 37 for switching the on/off state of the input voltage in order to prevent the voltage of a predetermined value or more from being applied to the microcomputer 34.

In this manner, the hybrid IC 5 on which the voltage measuring circuit 26 and the control unit 36 are mounted is disposed in the laminated manner on the board 3 on which the high-voltage connector 21, the low-voltage connector 31, the power supply 32, and the interface 33 are mounted. Thus, an area necessary for disposing the board 3 of the hybrid circuit 1 does not become larger as compared with a case where the entire constituent elements of the hybrid circuit 1 are mounted on the board 3. Further, since the voltage measuring circuit 26 is mounted on the hybrid IC 5, it is possible to avoid such a phenomenon that a foreign object enters into the voltage measuring circuit 26 to thereby place the circuit in a failure state due to a short-circuit.

Furthermore, since the voltage measuring circuit 26 and the control unit 36 are mounted on the hybrid IC 5 and the hybrid IC 5 itself constitutes a single part, the hybrid IC 5 can be sold as a single component. Further, the hybrid circuit 1 can be changed into another one of different specifications by replacing the hybrid IC 5 or the board 3 by another one. Thus, when there arises a need for changing the design etc. of the hybrid circuit 1, such the need can be satisfied by exchanging only the hybrid IC 5 or the board 3 without changing the entirety of the hybrid circuit 1. Therefore, it is possible to provide the hybrid circuit 1 of the high-voltage circuit and the low-voltage circuit excellent in the general-purpose properties.

The hybrid IC 5 is formed by the molding, the noise withstanding properties can be improved.

Furthermore, since the voltage measuring circuit 26 is disposed on the one side of the opposed two sides of the hybrid IC 5 and the control unit 36 is disposed on the other side thereof, it is possible to secure a sufficient insulation distance between the voltage measuring circuit 26 as the constituent element of the high-voltage circuit and the control unit 36 as a part of the constituent elements of the low-voltage circuit. Thus, it is possible to avoid the generation of the short-circuit due to the voltage difference between the voltage measuring circuit 26 and the control unit 36.

Figure 3:
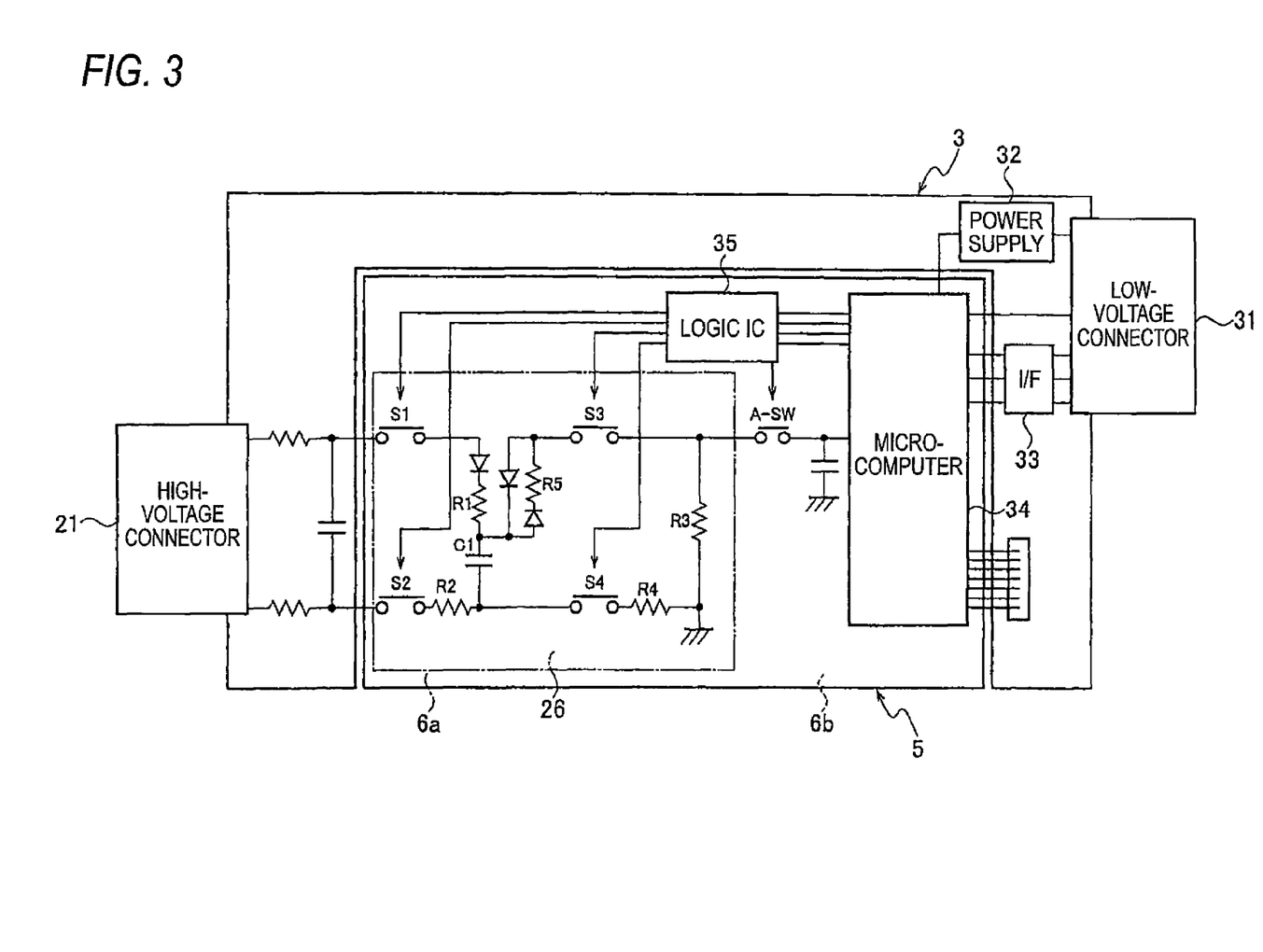
FIG. 3 is a plan view of the hybrid circuit according to the embodiment of the invention.
Figure 4:
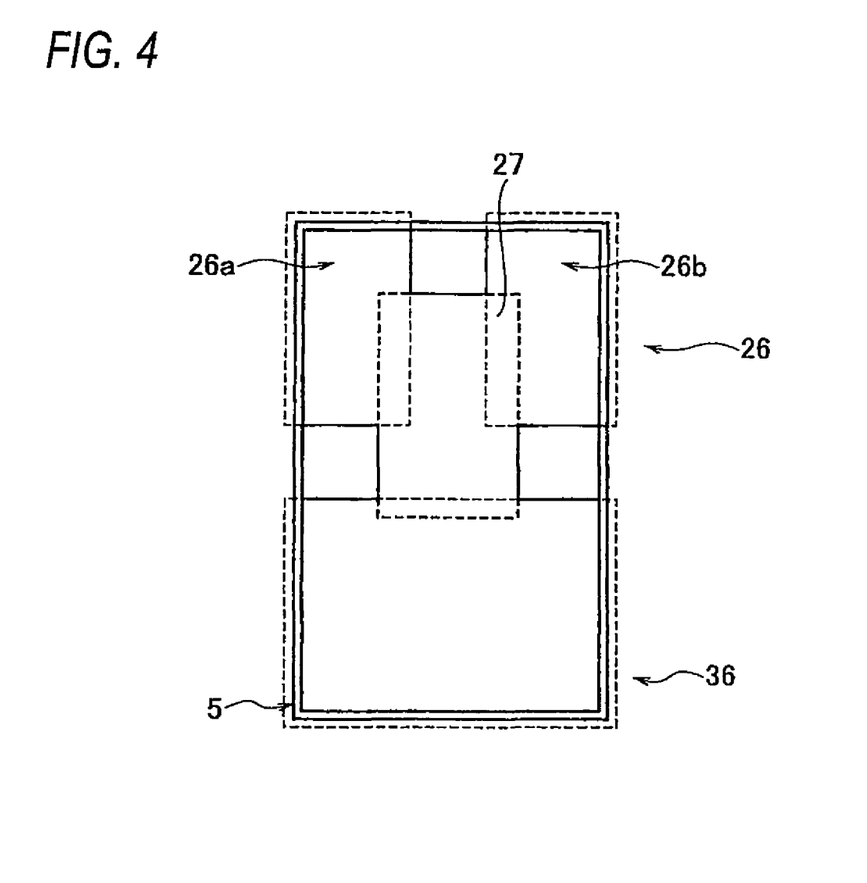
FIG. 4 is a diagram showing the circuit arrangement of the hybrid IC according to the embodiment of the invention.

Next, the mounting structure of the hybrid IC according to the embodiment of the invention will be explained with reference to FIGS. 3 and 4. FIG. 3 is a plan view of the hybrid circuit according to the embodiment of the invention. FIG. 4 is a diagram showing the circuit arrangement of the hybrid IC according to the embodiment of the invention.

As shown in FIG. 3, the voltage measuring circuit 26 includes a bipolar flying capacitor C1, switches S1, S2 for selectively connecting each of the bipolar electrodes of the flying capacitor C1 to the positive electrode or the negative electrode of the lithium ion battery B, and switches S3, S4 for selectively connecting each of the bipolar electrodes of the flying capacitor C1 to the microcomputer 34 and a grounding voltage portion. Each of the semiconductor switches 27 (S1 to S4) is a semiconductor switch which on/off states are changed over in accordance with an optical signal. The semiconductor switch is constituted by a photo MOSFET, for example.

In the voltage measuring circuit 26 shown in FIG. 3, at the time of measuring the voltage of the lithium ion battery B, firstly each of the switches S1 and S2 is turned on and each of the switches S3 and S4 is turned off under the control of the microcomputer 34, whereby a charge circuit is formed which starts from the positive electrode of the lithium ion battery B and reaches the negative electrode of the lithium ion battery B via the switch S1, a resistor R1, the one end of the flying capacitor C1, the other end thereof, a resistor R2 and the switch S2. In this charge circuit, the flying capacitor C1 is charged with electric charge amount according to the voltage of the lithium ion battery B. According to this charging, the one end and the other end of the flying capacitor C1 constitute the positive electrode and the negative electrode, respectively.

Succeeding, each of the switches S1 and S2 is turned off and each of the switches S3 and S4 is turned on under the control of the microcomputer 34, whereby the flying capacitor C1 is coupled in parallel to a series circuit of a resistor R5, a resistor R3 and a resistor R4. Then, of the divided voltages of the flying capacitor C1 divided by the resistors R5, R3, R4, the voltage corresponding to the difference between the voltages at the both ends of the resistor R3 is inputted into the microcomputer 34 and measured thereby. The microcomputer 34 calculates the charged voltage of the flying capacitor C1 based on the measured value and the voltage dividing ratios of the resistors R5, R3, R4 to thereby measure the voltage of the lithium ion battery B.

In this manner, the voltage measuring circuit 26 has a positive electrode side portion 26a (the switch S1, the resistor R1 and the one end of the flying capacitor C1) coupled to the positive electrode of the lithium ion battery B under the control of the microcomputer 34 and a negative electrode side portion 26b (the other end of the flying capacitor C1, the resistor R2 and the switch S2) coupled to the negative electrode of the lithium ion battery B under the control of the microcomputer 34.

Then, as shown in FIG. 4, since the positive electrode side portion 26a of the voltage measuring circuit 26 is disposed on the one side of the opposed two sides of the hybrid IC 5 and the negative electrode side portion 26b of the voltage measuring circuit 26 is disposed on the other-side thereof, it is possible to secure a sufficient insulation distance between the positive electrode side portion 26a and the negative electrode side portion 26b. Thus, it is possible to avoid the generation of the short-circuit due to the voltage difference between the positive electrode side portion 26a and the negative electrode side portion 26b.

Further, as shown in FIG. 4, the semiconductor switches 27 (S1 to S4) are disposed between the voltage measuring circuit 26 and the control unit 36. On/Off states of the semiconductor switches 27 (S1 to S4) are changed over in accordance with the optical signal. The semiconductor switches 27 (S1 to S4) have portions electrically isolated from one another. Since such the insulation portions are arranged between the voltage measuring circuit 26 and the control unit 36, the discharge paths therebetween are interrupted. Thus, the insulation state between the voltage measuring circuit 26 and the control unit 36 can be surely secured.

Further, the semiconductor switches 27 (S1 to S4) are also disposed between the positive electrode side portion 26a and the negative electrode side portion 26b. On/Off states of the semiconductor switches 27 (S1 to S4) are changed over in accordance with the optical signal. The semiconductor switches 27 (S1 to S4) have portions electrically isolated from one another. Since such the insulation portions are arranged between the positive electrode side portion 26a and the negative electrode side portion 26b, the discharge paths therebetween are interrupted. Thus, the insulation state between the positive electrode side portion 26a and the negative electrode side portion 26b of the voltage measuring circuit 26 can be surely secured.

In this manner, the hybrid circuit 1 according to the embodiment of the invention is configured in a manner that the hybrid IC 5 on which the voltage measuring circuit 26 as the constituent element of the high-voltage circuit and the control unit 36 as the constituent element of the low-voltage circuit are mounted is disposed in the laminated manner on the board 3. The high-voltage connector 21, the low-voltage connector 31, the power supply 32, and the interface 33 are mounted on the board 3. Thus, an area necessary for disposing the board 3 of the hybrid circuit 1 does not become larger as compared with a case where the entire constituent elements of the hybrid circuit 1 are mounted on the board 3.

Further, since the voltage measuring circuit 26 is disposed on the hybrid IC 5, it is possible to avoid such a phenomenon that a foreign object enters into the circuit to thereby place the voltage measuring circuit in a failure state due to a short-circuit.

Furthermore, since the control unit 36 for controlling the operation of the voltage measuring circuit 26 and the voltage measuring circuit 26 are mounted on the hybrid IC 5, the hybrid circuit 1 can be changed into another one of different specifications by replacing the hybrid IC 5 or the board 3 by another one. Thus, when there arises a need for changing the design etc. of the hybrid circuit 1, such the need can be satisfied by exchanging only the hybrid IC 5 or the board 3 without changing the entirety of the hybrid circuit 1. Therefore, it is possible to provide the hybrid circuit 1 of the high-voltage circuit and the low-voltage circuit excellent in the general-purpose properties.

As described above, according to the hybrid circuit 1 of the invention, it is possible to provide the hybrid circuit 1 of the high-voltage circuit and the low-voltage circuit which can suppress the increase of the disposing area, prevent the generation of the short-circuit and is excellent in the general-purpose properties.

Further, since the hybrid circuit 1 according to the embodiment of the invention is configured in a manner that the voltage measuring circuit 26 is disposed on the one side of the opposed two sides of the hybrid IC 5 and the control unit 36 is disposed on the other side thereof, it is possible to secure a sufficient insulation distance between the voltage measuring circuit 26 and the control unit 36. Thus, it is possible to avoid the generation of the short-circuit due to the voltage difference between the voltage measuring circuit 26 and the control unit 36.

Furthermore, in the hybrid circuit 1 according to the embodiment of the invention, the semiconductor switches 27 (S1 to S4) are disposed between the voltage measuring circuit 26 and the control unit 36. On/Off states of the semiconductor switches 27 (S1 to S4) are changed over in accordance with the optical signal. The semiconductor switches 27 (S1 to S4) have portions electrically isolated from one another. Since such the insulation portions are arranged between the voltage measuring circuit 26 and the control unit 36, the discharge paths therebetween are interrupted. Thus, the insulation state between the voltage measuring circuit 26 and the control unit 36 can be surely secured.

Furthermore, in the hybrid circuit 1 according to the embodiment of the invention, the positive electrode side portion 26a of the voltage measuring circuit 26 to be connected to the positive terminal of the lithium ion battery B under the control of the microcomputer 34 is disposed on the one side of the opposed two sides of the hybrid IC 5 and the negative electrode side portion 26b of the voltage measuring circuit 26 to be connected to the negative terminal of the lithium ion battery B under the control of the microcomputer 34 is disposed on the other side thereof. Thus, it is possible to secure a sufficient insulation distance between the positive electrode side portion 26a and the negative electrode side portion 26b. Accordingly, it is possible to avoid the generation of the short-circuit due to the voltage difference between the positive electrode side portion 26a and the negative electrode side portion 26b.

Furthermore, in the hybrid circuit 1 according to the embodiment of the invention, the semiconductor switches 27 (S1 to S4) which on/off states are changed over in accordance with the optical signal are disposed between the portion 26a and the negative electrode side portion 26b. The semiconductor switches 27 (S1 to S4) have portions electrically isolated from one another. Since such the insulation portions exist between the portion 26a and the negative electrode side portion 26b, the discharge paths therebetween are interrupted. Thus, it is possible to provide the hybrid circuit which is excellent in safety and in which the insulation state between the portion 26a and the negative electrode side portion 26b of the voltage measuring circuit 26 is secured.

Although the hybrid circuit according to the invention is explained based on the embodiment shown in the drawings, the invention is not limited thereto and the configurations of the respective portions may be replaced by arbitrary configurations having the similar functions, respectively.

For example, although the embodiment is explained in above, as to the hybrid circuit 1 for measuring the voltages of the respective cells of the lithium ion battery B, the invention can be applied to wide fields as the configuration for mounting, on a board, a hybrid circuit configured by a high-voltage circuit using a high power supply voltage and a low-voltage circuit using a low power supply voltage.

The present application is based on Japanese Patent Application No. 2009-290412 filed on Dec. 22, 2009, the contents of which are incorporated herein by reference.

Industrial Applicability

The invention is quite useful in the case of mounting a hybrid circuit of a high-voltage circuit and a low-voltage circuit using different power supply voltages on a board.

REFERENCE SIGNS LIST

1 hybrid circuit
3 board
5 hybrid IC
5a hybrid IC mounting area
6a high-voltage circuit mounting area
6b low-voltage circuit mounting area
21 high-voltage connector
26 voltage measuring circuit
26a positive electrode side portion
26b negative electrode side portion
27 semiconductor switch
31 low-voltage connector
32 power supply
33 interface
34 microcomputer
35 logic IC
36 control unit

The invention claimed is:

1. A hybrid circuit, comprising:
a high-voltage circuit and a low-voltage circuit having different power supply voltages, respectively;
a circuit board on which a connecting terminal for connecting an external element outside of the hybrid circuit is mounted; and
a hybrid integrated circuit mounted on the circuit board,
wherein the low-voltage circuit includes a control unit for controlling an operation of the high-voltage circuit,
wherein the control unit and the high-voltage circuit are integrated in the hybrid integrated circuit,
wherein the high-voltage circuit includes:
a positive electrode side portion which is connected to a positive electrode of a high-voltage power supply under a control of the control unit; and
a negative electrode side portion which is connected to a negative electrode of the high-voltage power supply under the control of the control unit,
wherein the positive electrode side portion is disposed on one side of opposed two sides of the hybrid integrated circuit and the negative electrode side portion is disposed on an other side thereof,
wherein the hybrid integrated circuit has atop surface, the high-voltage circuit and the low-voltage circuit being disposed adjacent to each other on the top surface in anon-overlapping manner, and
wherein the high-voltage circuit is disposed on one side which is different from the opposed two sides of the hybrid integrated circuit where the positive and negative electrode side portions are disposed and the low-voltage circuit is disposed on the other side thereof,
wherein the positive electrode side portion is nearer the one side of the opposed two sides of the hybrid integrated circuit than the other side, and the negative electrode side portion is nearer the other side of the opposed two sides of the hybrid integrated circuit than the one side.

2. The hybrid circuit according to claim 1, further comprising:
a semiconductor switch disposed between the positive electrode side portion and the negative electrode side portion,
wherein the semiconductor switch comprises portions electrically isolated from one another.

3. The hybrid circuit according to claim 1, further comprising a power supply which is mounted on the circuit board.

4. The hybrid circuit according to claim 1, further comprising an interface, which is mounted on the circuit board, coupled to the control unit.

5. The hybrid circuit according to claim 1, wherein the high-voltage circuit and the low-voltage circuit are adjacent to each other in a first direction, and the positive side electrode portion and the negative electrode side portion are adjacent to each other in a second direction that intersects with the first direction.

6. The hybrid circuit according to claim 5, wherein the first direction intersects with the second direction in an orthogonal direction.

\* \* \* \* \*